US008779501B2

(12) United States Patent
Lee

(10) Patent No.: US 8,779,501 B2
(45) Date of Patent: Jul. 15, 2014

(54) DIODE-BASED FLASH MEMORY DEVICE CELL STRING AND FABRICATING METHOD THEREFOR

(75) Inventor: Jong-Ho Lee, Seoul (KR)

(73) Assignee: SNU R&DB Foundation (KR)

( * ) Notice: Subject to any disclaimer, the term of this patent is extended or adjusted under 35 U.S.C. 154(b) by 305 days.

(21) Appl. No.: 13/055,881

(22) PCT Filed: May 8, 2009

(86) PCT No.: PCT/KR2009/002414
§ 371 (c)(1),
(2), (4) Date: Apr. 29, 2011

(87) PCT Pub. No.: WO2010/013886
PCT Pub. Date: Feb. 4, 2010

(65) Prior Publication Data
US 2011/0254076 A1  Oct. 20, 2011

(30) Foreign Application Priority Data

Jul. 28, 2008 (KR) ..................... 10-2008-0073778

(51) Int. Cl.
*H01L 29/792* (2006.01)
*H01L 29/66* (2006.01)
*H01L 27/115* (2006.01)

(52) U.S. Cl.
CPC ......... *H01L 29/792* (2013.01); *H01L 29/66833* (2013.01); *H01L 27/11568* (2013.01)
USPC ........... 257/324; 257/316; 257/317; 257/322; 257/E29.309

(58) Field of Classification Search
CPC ............ H01L 29/792; H01L 29/66833; H01L 27/11568
USPC ................... 257/324, 316, 317, 322, E29.309
See application file for complete search history.

(56) References Cited

U.S. PATENT DOCUMENTS 5,488,245 A * 1/1996 Shimizu et al. ............... 257/316
6,995,424 B2   2/2006 Lee
(Continued)

FOREIGN PATENT DOCUMENTS

KR   10-2004-0064339   7/2004
KR      10-0831390     5/2008
(Continued)

OTHER PUBLICATIONS

Charles Kuo, "A Capacitorless Double Gate DRAM Technology for Sub-100-nm Embedded and Stand-Alone Memory Applications," IEEE Transactions on Electron Devices, vol. 50, No. 12, Dec. 2003, pp. 2408-2416.
(Continued)

*Primary Examiner* — Dale E Page
(74) *Attorney, Agent, or Firm* — Cantor Colburn LLP

(57) ABSTRACT

Provided is an ultra highly-integrated flash memory cell device. The cell device includes a semiconductor substrate, a first doping semiconductor area formed on the semiconductor substrate, a second doping semiconductor area formed on the first doping semiconductor area, and a tunneling insulating layer, a charge storage node, a control insulating layer, and a control electrode which are sequentially formed on the second doping semiconductor area. The first and second doping semiconductor areas are doped with impurities of the different semiconductor types According to the present invention, it is possible to greatly improve miniaturization characteristics and performance of the cell devices in conventional NOR or NAND flash memories. Unlike conventional transistor type cell devices, the cell device according to the present invention does not have a channel and a source/drain. Therefore, in comparison with the conventional memories, the fabricating process can be simplified, and the problem such as cross-talk or read disturb can be greatly reduced.

4 Claims, 18 Drawing Sheets

(56) References Cited

U.S. PATENT DOCUMENTS

| | | | |
|---|---|---|---|
| 7,495,284 B2 | 2/2009 | Lee | |
| 2003/0218494 A1* | 11/2003 | Kubo et al. | 327/534 |
| 2004/0135194 A1 | 7/2004 | Lee | |
| 2006/0102952 A1 | 5/2006 | Lee | |
| 2006/0240612 A1 | 10/2006 | Lee | |

FOREIGN PATENT DOCUMENTS

| | | |
|---|---|---|
| KR | 10-2008-0050654 | 6/2008 |
| WO | 2008/062974 | 5/2008 |
| WO | 2008/069539 | 6/2008 |

OTHER PUBLICATIONS

Chang Woo Oh et al., "Floating Body DRAM Characteristics of Silicon-On-ONO (SOONO) Devices for System-on Chip (SoC) Applications," 2007 Symposium on VLSI Technology Digest of Technical Papers, pp. 168-169.

Sang-Pil Sim et al., "Fully 3-Dimensional NOR Flash Cell with Recessed Channel and Cylindrical Floating Gate-A Scaling Direction for 65nm and Beyond," 2006 Symposium on VLSI Technology Digest of Technical Papers.

Ki-Tae Park et al., "A 64-Cell NAND Flash Memory with Asymmetric S/D Structure for Sub-40nm Technology and Beyond," 2006 Symposium on VLSI Technology Digest of Technical Papers.

Alvaro Padilla et al., "Enhanced Endurance of Dual-bit SONOS NVM Cells using the GIDL Read Method," 2008 Symposium on VLSI Technology Digest of Technical Papers pp. 142-143.

Arvind Kumar et al., Scaling of Flash NVRAM to 10's of nm by Decoupling of Storage From Read/Sense Using Back-Floating Gates, IEEE Transactions on Nanotechnology, vol. 1, No. 4, Dec. 2002, pp. 247-254.

\* cited by examiner

FIG. 1
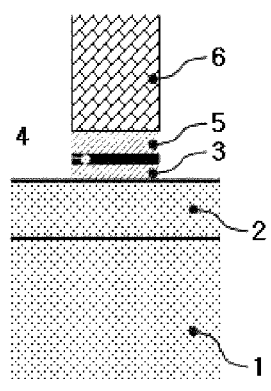 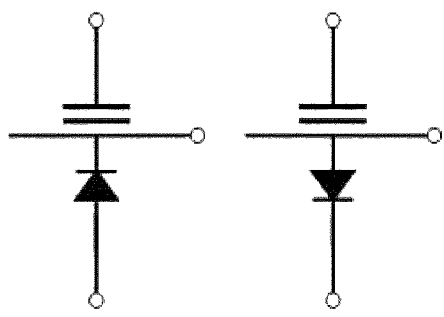
(a) (b) (c)

FIG. 2
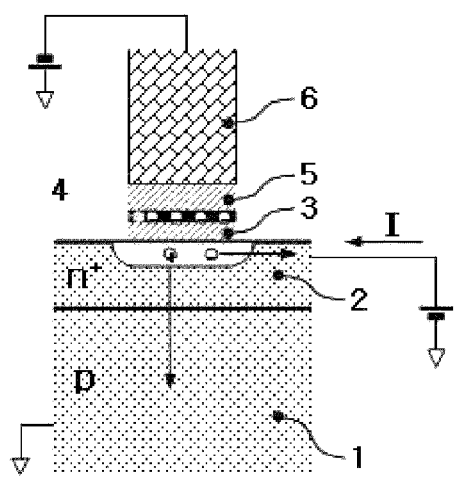 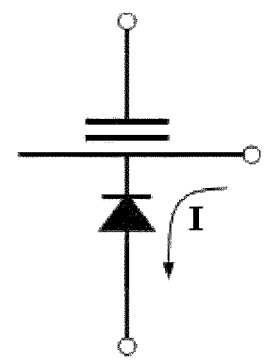
(a) (b)

FIG. 3
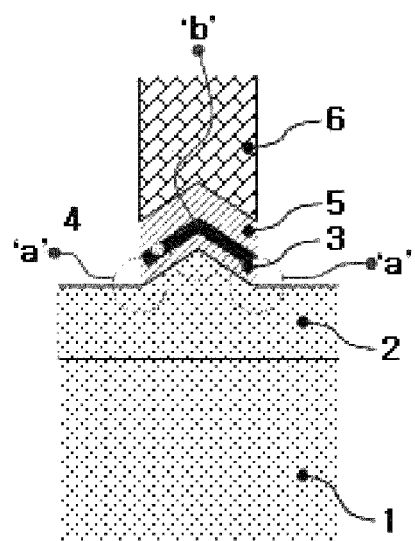
(a)
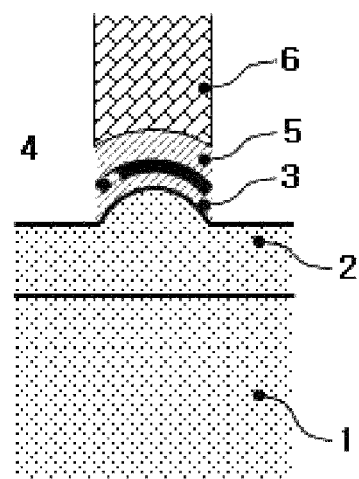
(b)

FIG. 4
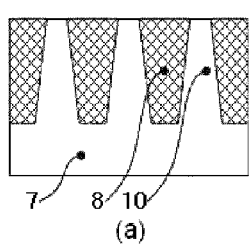
(a)
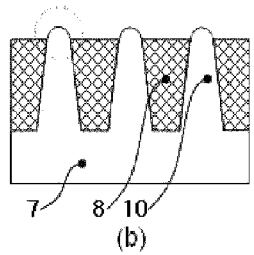
(b)
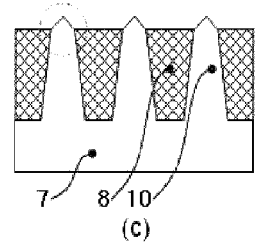
(c)
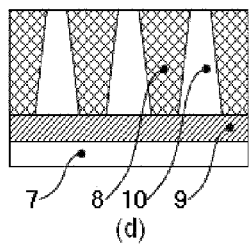
(d)
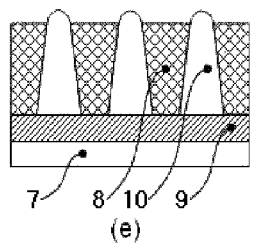
(e)
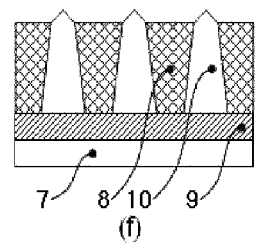
(f)

FIG. 5
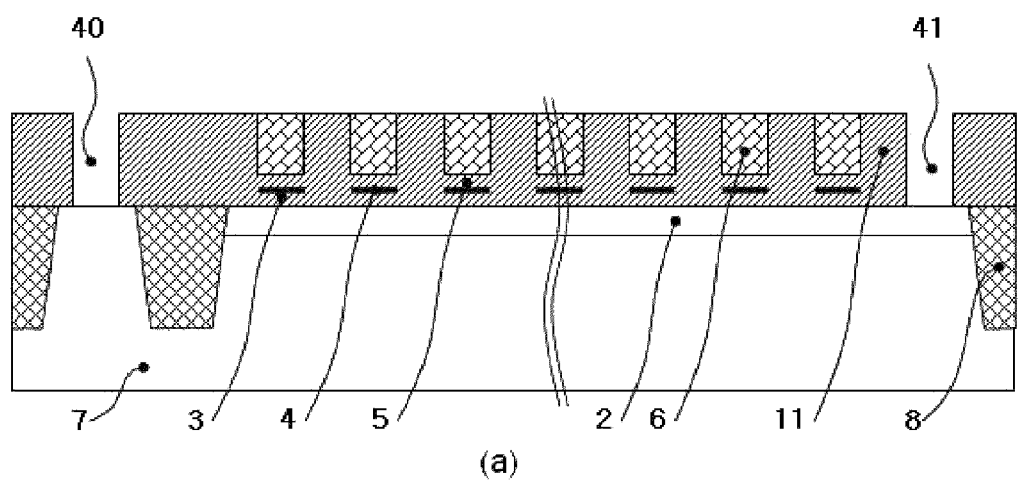
(a)
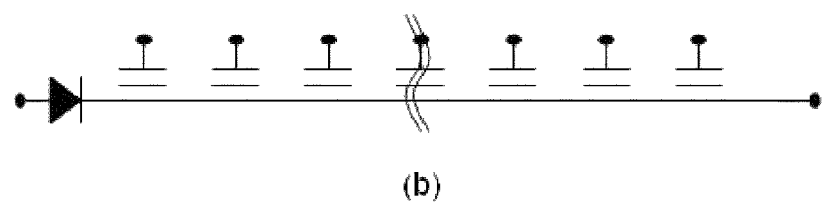
(b)

FIG. 18
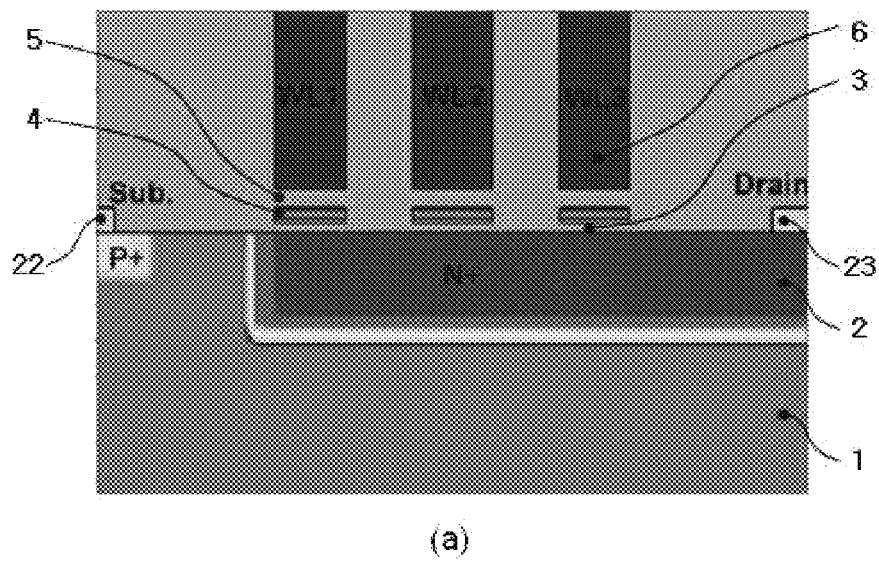
(a)
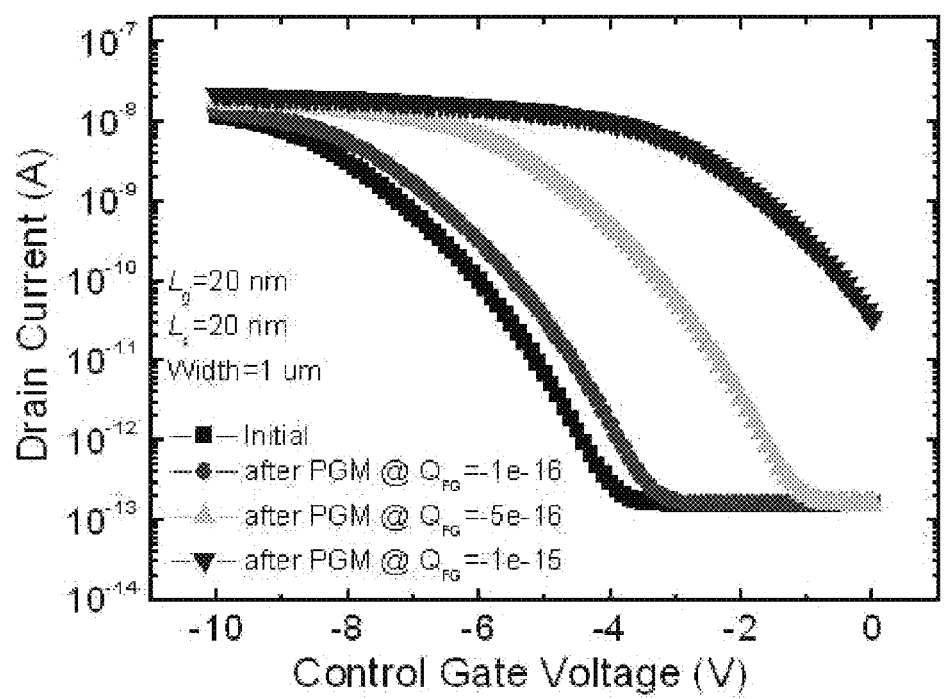
(b)

DIODE-BASED FLASH MEMORY DEVICE CELL STRING AND FABRICATING METHOD THEREFOR

TECHNICAL FIELD

The present invention relates to a flash memory cell device, a cell string, and a fabricating method thereof, and more particularly to, a flash memory cell device and a cell string having a new structure capable of solving problems of conventional MOS based flash memory cell device and the cell string and a fabricating method thereof.

BACKGROUND ART

Recently, since demands for a flash memory greatly increase in consumer electronics and mobile electronic apparatuses, a market of the flash memory is expected to continuously increase. In addition, demands for a cell device having a high integration density, a high durability, and high-speed write/erase characteristics have been increased. Particularly, the integration degree of a NAND flash memory has been required to continuously increase as IT technologies are developed. The integration density of the NAND flash memory greatly depends on the integration density of the cell devices. Recently, the gate length of a cell device is reduced down to 50 nm, and the memory capacity reaches several tens of giga bits. In addition, demands for multi-level cell devices have been increased. However, the short channel effect due to device miniaturization increases dispersion of a threshold voltage in the implementation of the multi-level cell, the device miniaturization of the multi-level cell may be limitatively used, or it cannot be used. In order to improve the integration density, the gate length needs to be continuously reduced. Therefore, other techniques have to be considered.

In a conventional NAND flash memory using floating gates, serious problems of cross-talk between cells occur as cell miniaturization proceeds. In order to increase the integration density of a conventional device having a floating poly electrode, an SONOS flash memory cell that uses an insulating storage electrode such as nitride layer as a memory storage node has been considered. In addition, a nano-floating gate memory (NFGM) cell that uses nano-sized dots or nano-sized crystals as a storage electrode has been considered. In a case where a memory cell is embodied by using a storage electrode such as nano-sized dots or a nitride layer on a conventional planar channel structure, miniaturization characteristics can be improved in comparison with a case where a memory cell is embodied by using a conventional conductive polysilicon floating gate. However, although the improved storage electrode is used, in a case where the gate length is equal to or less than 30 nm, the characteristics are greatly deteriorated, or the miniaturization may not be obtained due to the short channel effect.

In order to suppress the short channel effect caused in a case where a gate length of a cell device decreases below 40 nm and reduce a dispersion of a threshold voltage, an SONOS or TANOS (TaN—AlO—SiN-Oxide-Si) cell device having an asymmetric source/drain structure on a planar channel device is proposed by Samsung Electronics Co., Ltd (K. T. Park et al, A 64-cell NAND flash memory with asymmetric S/D structure for sub-40 nm technology and beyond, in Technical Digest of Symposium on VLSI Technology, p. 24, 2006). The aforementioned the cell device has a structure where, with respect to a gate of the cell device, there is a region corresponding to a source or a drain in the one side thereof, and there is neither source nor drain in the other side thereof. In the cell device having the structure, the short channel effect is suppressed by forming an inversion layer using a fringe field from a control electrode in the region where there is neither source nor drain. Although the miniaturization characteristic of the cell device is improved in comparison with a conventional SONOS the cell device having a planar channel and a source/drain region, since one of the source and the drain of the cell device is formed so as to be overlapped with the control electrode, the short channel effect occurs in the channel length equal to or less than 40 nm. As a result, there is a limitation in miniaturization of the cell device having a flat channel structure.

A flash device structure in which a channel is recessed and a conductive floating gate is used as a storage electrode so as to reduce the short channel effect occurring in the conventional planar channel structure is proposed by Samsung Electronics Co., Ltd. (S.-P. Sim et al, Full 3-dimensional NOR flash cell with recessed channel and cylindrical floating gate—A scaling direction for 65 nm and beyond, in Technical Digest of Symposium on VLSI Technology, p. 22, 2006). However, in the flash device having such a structure, the width of the recessed region needs to be reduced as the device miniaturization proceeds. Accordingly, there is a problem in that device characteristics deteriorate, and non-uniformity of the device increases.

The inventor has researched a NAND string structure having no source/drain, and the invention titled, "Highly-Integrated Flash Memory Cell String, Cell Device, and Method of Fabricating thereof" was filed and registered as Korean Patent No. 10-856701. With respect to the structure disclosed in the invention, the process of fabricating a NAND string is simple, and there is no source/drain in the cell device, so that it is possible to improve device miniaturization characteristics, program characteristics, and the like. Herein, although the cell device has no source/drain, the cell device is based on a MOS structure having a channel. Therefore, a new cell device structure which does not employ the MOS structure is needed.

A result of research of implementing memory operations by reading GIDL (Gate Induced Drain Leakage) in a FinFET-based SONOS flash memory, of which the device miniaturization characteristics are good, at the level of a single cell device was published (Alvaro Padilla et al., Enhanced endurance of dual-bit SONOS NVM cells using the GIDL read method, in Technical Digest of Symposium on VLSI Technology, p. 143, 2008). Since the cell device is also based on the cell having a MOS structure, there are problems such as problems in the processes of fabricating a miniaturized MOS device and problems of a change in a threshold voltage.

In this manner, development of new cell devices and cell strings capable of solving the problems of the previously proposed devices, simplifying the fabricating processes, and increasing a integration density and performance has been required.

DISCLOSURE

Technical Problem

The present invention is to provide a highly-integrated flash memory cell device having a new structure and a method of fabricating thereof capable of efficiently solving problems associated with device miniaturization and increasing a integration density and performance.

The present invention is to provide a cell string including the aforementioned cell devices and a method of fabricating thereof.

Technical Solution

According to a first aspect of the present invention, there is provided a flash memory cell device including a semiconductor substrate; a first doping semiconductor area which is doped with specific type impurities and formed on the semiconductor substrate; a second doping semiconductor area which is doped with impurities of which the type is opposite to the type of the first doping semiconductor area and formed on the first doping semiconductor area; a tunneling insulating layer formed on the second doping semiconductor area; and a charge storage node, a control insulating layer, and a control electrode which are sequentially formed on the tunneling insulating layer.

In the flash memory cell device according to the aforementioned aspect, it is preferable that in the case where the first doping semiconductor area is a p type semiconductor, the second doping semiconductor area is an n type semiconductor, and in the case where the first doping semiconductor area is an n type semiconductor, the second doping semiconductor area is a p type semiconductor.

In the flash memory cell device according to the aforementioned aspect, it is preferable that the surface of the second doping semiconductor area of the flash memory cell device is configured so that the height of a position in the central portion of the control electrode in the direction parallel to or perpendicular to the control electrode is larger than the height of positions in the two end portions of the control electrode.

In the flash memory cell device according to the aforementioned aspect, it is preferable that a buried insulating layer formed under the first doping semiconductor area is further included, and the charge storage node is formed so as to be localized under the control electrode or formed so as to be extended in the left and right directions of the control electrode.

In the flash memory cell device according to the aforementioned aspect, it is preferable that the flash memory cell device reads an amount of a current flowed due to GIDL (Gate Induced Drain Leakage) between the first doping semiconductor area and the second doping semiconductor area according to a state of program or erase to sense the state or degree of program. In addition, it is preferable that the flash memory cell device is configured so that multiple levels of two bits or more can be stored in one cell by adjusting a program voltage, an erase voltage, a program time, or an erase time.

According to a second aspect of the present invention, there is provided a flash memory cell string including a plurality of cell devices arrayed in a row, in which each of cell devices includes: a semiconductor substrate; a first doping semiconductor area doped with a first semiconductor type and formed on the semiconductor substrate; a second doping semiconductor area doped with a semiconductor type opposite to the first semiconductor type and formed on the first doping semiconductor area; and a tunneling insulating layer formed on the second doping semiconductor area; a charge storage node, a blocking insulating layer, and a control electrode sequentially formed on the tunneling insulating layer, wherein the cell string is configured so that insulating layers formed between control electrodes of the cell devices are included, the first doping semiconductor areas of the cell devices are connected to each other, the second doping semiconductor areas of the cell devices are connected to each other, and electrodes for electrical contact with the connected the first and second doping semiconductor areas are included.

According to a third aspect of the present invention, there is provided a flash memory cell string including a plurality of cell devices arrayed in a row and a switching device formed at an end portion of the connected cell devices, in which each of cell devices includes: a semiconductor substrate; a first doping semiconductor area doped with a first semiconductor type and formed on the semiconductor substrate; a second doping semiconductor area doped with a semiconductor type opposite to the first semiconductor type and formed on the first doping semiconductor area; a tunneling insulating layer formed on the second doping semiconductor area; and a charge storage node, a blocking insulating layer, and a control electrode sequentially formed on the tunneling insulating layer, wherein the cell string is configured so that insulating layers formed between control electrodes of the cell devices are further included, one or two or more switching devices are included at one portion or two end portions of the connected cell devices, and wherein the switching device is configured so that an electrode for electrical contact is connected to a source or drain in the portion which is not connected to the cell device, and an electrode for electrical contact with the connected first doping semiconductor area is included.

In the flash memory cell string according to the second and third aspects, it is preferable that the surface of the second doping semiconductor area of the flash memory cell device is configured so that the height of a position in the central portion of the control electrode in the direction parallel to or perpendicular to the control electrode is larger than the height of positions in the two end portions of the control electrode. In addition, it is preferable that the cell device further includes a buried insulating layer formed under the first doping semiconductor area.

In the flash memory cell string according to the second and third aspects, it is preferable that electrical contact window of the first doping semiconductor area is formed through the contact of the semiconductor substrate which is commonly formed, or the first doping semiconductor area is formed in a well having a different doping type and the electrical contact window of the first doping semiconductor area may be formed independently in each cell string or in each cell string module which include several cell strings.

In the flash memory cell string according to the second and third aspects, it is preferable that the cell string and a MOS device as a control circuit are integrated in the same semiconductor substrate.

According to a fourth aspect of the present invention, there is provided a method of fabricating a flash memory device including steps of: (a) forming a first doping semiconductor area on a semiconductor substrate; (b) forming an isolation insulating layer as a device isolation area on the resulting product of the step (a); (c) forming a second doping semiconductor area on the resulting product of the step (b); (d) forming a tunneling insulating layer, a charge storage node, and a blocking insulating layer on the resulting product of the step (c) and forming a control electrode; (e) forming a first insulating layer as an interlayer insulating layer; and (f) forming contacts at positions where the contacts are needed and sequentially forming metal layers, wherein the first doping semiconductor area and the second doping semiconductor area are formed so as to be doped with different semiconductor types.

According to a fifth aspect of the present invention, there is provided a method of fabricating a flash memory device including steps of: (a) forming a first doping semiconductor area on a semiconductor substrate; (b) forming an isolation insulating layer as a device isolation area on the resulting product of the step (a); (c) forming a second doping semiconductor area on the resulting product of the step (b); (d) forming a switching device and a MOS device on the resulting product of the step (c); (e) forming a tunneling insulating layer, a charge storage node, and a blocking insulating layer on the resulting product of the step (d) and forming a control electrode to form cell devices; (f) forming a first insulating layer as an interlayer insulating layer; and (g) forming contacts at positions where the contacts are needed and sequentially forming metal layers, wherein the first doping semiconductor area and the second doping semiconductor area are formed so as to be doped with different semiconductor types.

Advantageous Effects

Unlike conventional MOS transistor structures, the cell device as a device specialized in flash memories according to the present invention is configured to have a structure where a source/drain and a channel do not exist, so that it is possible to increase a integration density and performance.

FIG. 18 is a graph illustrating data of an experiment with respect to a cell string so as to show effects of the cell string including the cell devices according to the present invention. (a) of FIG. 18 is a cross-sectional view illustrating a simulation of a structure of the cell string. Herein, a first doping semiconductor area 1 is a p type semiconductor, and a second doping semiconductor area 2 is an n+ type semiconductor. An area 22 indicates an electrode of the first doping semiconductor area, and an area 23 indicates an electrode of the second doping semiconductor area. (b) of FIG. 18 illustrates I-V characteristics obtained from the cell string including three cell devices illustrated in (a) of FIG. 18. Herein the drain current is a current flowing through the electrode of the second doping semiconductor area in the area 23. In the case where the voltage of the control electrode 6 is about −3V, the current is greatly increased according to an amount of negative ions programmed in the charge storage node 4. It can be seen that, in the case where negative ions of about $3\times10^{13}$ $cm^{-2}$ ($=1\times10^{-15}$ C) are stored, the current is increased by ten thousands or more in comparison with the case where no charges are stored. The difference in the current can be easily sensed by a typical circuit. It can be understood from FIG. 18 that the current flowed due to GIDL is greatly changed according to an amount of the charges injected into the charge storage node 4 of the cell device according to the present invention. By using this configuration, a multi-level cell can be implemented. In other words, the multi-level cell can be implemented by adjusting a time of injecting charges into the charge storage node or by adjusting a program voltage or an erase voltage.

Together with the above advantages, the following advantages can be obtained.

Firstly, unlike the conventional MOS transistor type cell device of which the fabricating process is very difficult as the miniaturization proceeds, in the structure of the cell device according to the present invention, source/drain and a channel do not exist, so that the fabricating process can be simplified.

Secondly, in comparison with the conventional MOS transistor type cell device, the processes for forming elements of the cell device according to the present invention are simple and a change in characteristics is small, so that the dispersion characteristics of the device is relatively small.

Thirdly, in the reading operation for a specific cell device, no pass voltage or a low pass voltage may be applied to other cell devices, so that the read disturb problem does not occur.

Fourthly, in comparison with the conventional NAND or NOR type, in the type of array of the cells or the cell strings according to the present invention, a degree of freedom is large. In the case of a cell string including switching devices, the number thereof can be reduced, so that the integration density can be further increased.

DESCRIPTION OF DRAWINGS

FIG. 1 is a cross-sectional view and an equivalent device diagram illustrating a cell device according to a first embodiment of the present invention.

FIG. 2 is a cross-sectional view for explaining operations of the cell device according to the first embodiment of the present invention and a diagram illustrating a direction of current flow in a reading operation in a state where the cell device is programmed.

FIG. 3 is cross-sectional views illustrating cell devices according to a second embodiment of the present invention.

FIG. 4 is cross-sectional views illustrating fence-shaped bodies 10 implemented so as to be parallel to control electrodes 6 of cell devices according to the present invention.

FIG. 5 is a cross-sectional view and an equivalent circuit diagram illustrating a cell string implemented by using the cell device according to the first embodiment of the present invention.

FIG. 18 is a graph illustrating an I-V characteristic curve of a cell string so as to show effects of the cell string including cell devices according to the present invention.

[Best Mode]

Figure 6:
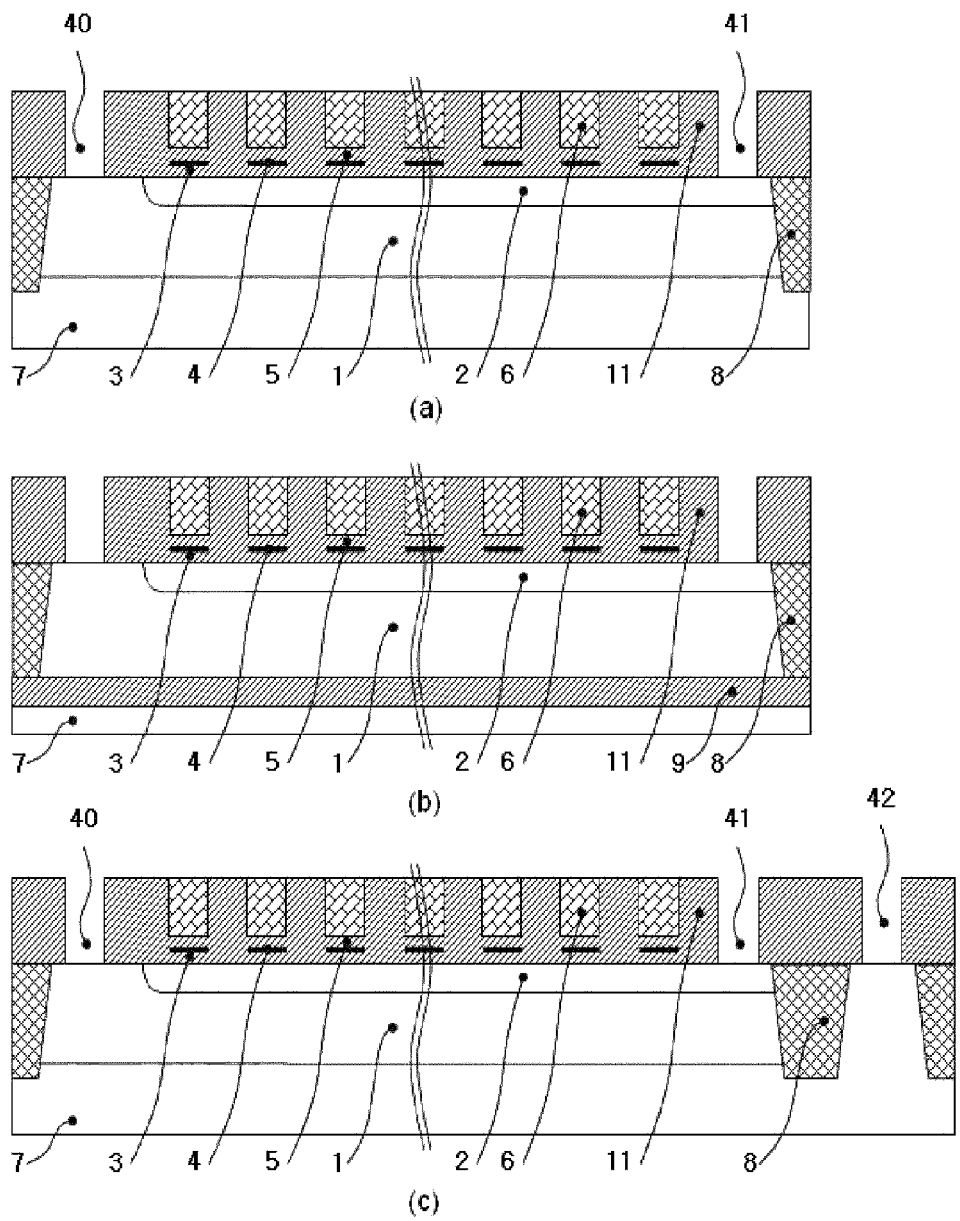
FIGS. 6 and 7 are cross-sectional views illustrating modified examples of the cell string according to the third embodiment of the present invention.

Hereinafter, structures and operations of the flash memory cell devices and the cell strings and fabricating methods thereof according to preferred embodiments of the present invention will be described in detail with reference to the accompanying drawings. For the convenience of description and the better understanding, in the accompanying drawings, metal layers in the upper portions are removed in the illustration, and control electrodes 6 or gate electrodes 16 of MOS devices are illustrated with the upper portions being cut.

First Embodiment: Flash Memory Cell Device

Now, a structure and operations of a flash memory cell device according to a first embodiment of the present invention are described with reference to FIGS. 1 and 2.

(a) of FIG. 1 is a cross-sectional view illustrating the flash memory cell device according to the first embodiment of the present invention in a direction intersecting the control electrode 6. Referring to (a) of FIG. 1, the flash memory cell device according to the first embodiment of the present invention includes a first doping semiconductor area 1 which is formed on a semiconductor substrate, a second doping semiconductor area 2 which is formed on the first doping semiconductor area, a tunneling insulating layer 3 which is formed on the second doping semiconductor area, and a charge storage node 4, a control insulating layer 5, and a control electrode 6 which are sequentially formed on the tunneling insulating layer. Herein, the first doping semiconductor area and the second doping semiconductor area 2 need to be different from each other in the semiconductor type of doped impurities. In addition, it is preferable that the doping concentration of the second doping semiconductor area is higher than that of the first doping semiconductor area.

One of the important features of the cell device according to the first embodiment of the present invention is that there is no source/drain and there is no channel unlike a conventional MOS transistor based the cell device. With respect to a conventional MOS transistor type cell device, the fabricating processes are gradually difficult as the miniaturization proceeds, and thus, the dispersion of characteristics of the cell device tends to be increased. (b) and (c) of FIG. 1 are equivalent circuit diagram illustrating a symbol of the cell device illustrated in (a) of FIG. 1. In (b) of FIG. 1, the first doping semiconductor area 1 is of a p type, and the second doping semiconductor area 2 is of an n type. In (c) of FIG. 1, the semiconductor types are opposite to those of (b) of FIG. 1.

Now, the operations of the cell device according to the first embodiment are described with reference to FIG. 2. FIG. 2 is a cross-sectional view for explaining the operations of the cell device of FIG. 1. FIG. 2 explains a principle and direction of current flow between the first and second doping semiconductor areas in the cell device during a reading operation. For example, it is assumed that the first doping semiconductor area 2 is of a p type and the second doping semiconductor area 1 is of an n+ type. If a negative voltage is applied to the control electrode 6 and a positive voltage is applied to the second doping semiconductor area, electron-hole pairs (Electron-Hole Pairs; EHPs) are generated on the surface of the n+ semiconductor area, which is in contact with the tunneling insulating layer 3, due to band-to-band tunneling. The generated electrons are moved to the second doping semiconductor area 2 to which a positive voltage is applied, and the generated holes are diffused as minority carriers to be moved to the first doping semiconductor area 1. As a result, the current is flowed as illustrated in FIG. 2. In the state where positive charges exist or no negative charge exists in the charge storage node 4, a very small number of the electron-hole pairs exist in the surface area, so that a small amount of the current is flowed. However, if negative charges are stored in the charge storage node through a program, much more number of the electron-hole pairs is generated during the reading operation. In this case, since much more amount of the current is flowed, this state can be more easily distinguished from the state where charges are erased. A memory cell can be configured by using this principle.

[Mode for Invention]

Second Embodiment: Flash Memory Cell Device

Now, structures and operations of a flash memory the cell device according to a second embodiment are described. The structure of the cell device according to the second embodiment of the present invention is similar to that of the cell device according to the first embodiment. However, the shapes of the second doping semiconductor area, the control electrode, the tunneling insulating layer, the charge storage node, the control insulating layer, and the like are different.

FIG. 3 illustrates cross-sectional views of various examples of the cell device according to the second embodiment of the present invention. Referring to (a) and (b) of FIG. 3, the cell device according to the second embodiment of the present invention is formed so that the central portion 'b' of the second doping semiconductor area 2 disposed below the control electrode 6 is higher than the two ends 'a'. In (a) of FIG. 3, the central portion of the second doping semiconductor area 2 is higher, and the shape thereof is sharply convex in the upward direction. In (b) of FIG. 3, the central portion of the second doping semiconductor area 2 is higher, and the shape thereof is round and convex in the upward direction. However, the shape of the surface of the second doping semiconductor area 2 is not limited to the shapes illustrated in FIG. 3. Any shape, which is configured so that the height of the central portion 'b' is higher than the height in the two end portions 'a', can be employed. In the structure of the cell device according to the second embodiment, since the electric field of the control electrode 6 can be concentrated on the convex portion, it is possible to obtain advantages in that the program/erase rate is increased or the program/erase operating voltage can be reduced.

FIG. 4 is cross-sectional views illustrating fence-shaped bodies 10 which are formed in the direction parallel to the control electrodes 6 of the cell devices according to the present invention. Referring to FIG. 4, the fence-shaped bodies are configured to have various upper surface structures. (a) to (c) of FIG. 4 are similar to (d) to (f) of FIG. 4 except that the structures of (d) to (f) further include buried insulating layers 9 under the fence-shaped bodies 10. (a) and (d) of FIG. 4 illustrate that the upper surfaces of the fence-shaped bodies 10 where the cell device is formed are flat. (b), (c), (e), and (f) of FIG. 4 illustrate that the upper surfaces of the fence-shaped bodies 10 are configured to further protrude in comparison with the surfaces of the isolation insulating layers 8. In comparison with the structures illustrated in (a) and (d) of FIG. 4, in the structures illustrated in (b), (c), (e), and (f) of FIG. 4, since the electric field from the control electrode 6 can be concentrated on the surface of the second doping semiconductor area, it is possible to improve the program and erase characteristics. On the other hand, the buried insulating layers 9 in (d), (e) and (f) of FIG. 4 can reduce leakage currents occurring between the first doping semiconductor area and the substrate 7 or the well. If the leakage currents are reduced, it is possible to decrease the lower limit value of the operating current during the reading operation.

Third Embodiment: Cell String

Now, structures and operations of a cell string constructed by using a cell device according to the present invention are described.

FIG. 5 illustrates a cross-sectional view and an equivalent circuit diagram of a cell string constructed by using the cell device according to the first embodiment of the present invention illustrated in FIG. 1. (b) of FIG. 5 illustrates a symbol of a cell string. The direction of a diode disposed at the left side of the symbol of the cell string is arbitrarily set. If the doping types of the first and the second doping semiconductor areas are changed, the direction may also be changed. Referring to FIG. 5, in the cell string according to the third embodiment of the present invention, flash memory cell devices including a first doping semiconductor area 1 which is formed on a semiconductor substrate 7, a second doping semiconductor area 2 which is formed on the first doping semiconductor area, a tunneling insulating layer 3 which is formed on the second doping semiconductor area, a charge storage node 4, a blocking insulating layer 5, and a control electrode 6 which are sequentially formed on the tunneling insulating layer are disposed in a row. Herein, since the semiconductor types of the doped impurities of the first doping semiconductor area 1 and the semiconductor substrate 7 are the same, the first doping semiconductor area 1 is not illustrated to be distinguished from the semiconductor substrate 7 in FIG. 5.

The cell string includes insulating layers 11 which are formed between the control electrodes 6 of the cell devices so as to electrically separate the control electrodes of the cell devices from each other.

In the cell string, the first doping semiconductor areas 1 of the cell devices are connected to each other; the second doping semiconductor areas 2 of the cell devices are also connected to each other; and electrodes for electrical contacts of the connected first doping semiconductor areas and the connected second doping semiconductor areas are included. In the cell string, the electrical contact windows 41 of the second doping semiconductor areas 2 are formed at the right end portion of the cell string. The electrical contact windows 40 of the first doping semiconductor areas 1 are formed on the left end portion on the surface of the semiconductor substrate. Herein, the first doping semiconductor area 1 is doped with impurities of the same doping type as that of the impurities of the semiconductor substrate 7, so that the electrical contact of the first doping semiconductor area is commonly used as a substrate contact.

Modified Examples of Cell String

Now, various modified examples of the cell string according to the present invention are described with reference to FIGS. 6 and 7.

FIG. 6 illustrates cross-sectional views of various modified example of the cell string according to the third embodiment of the present invention illustrated in FIG. 5. The cell string illustrated in (a) of FIG. 6 is similar to the cell string illustrated in (a) of FIG. 5 except that the first doping semiconductor area 1 is distinguished from the semiconductor substrate 7. This figure illustrates the case where a well having a doping type different from that of the first doping semiconductor area is formed in the semiconductor substrate 7. (b) of FIG. 6 is a cross-sectional view illustrating a cell string where a buried insulating layer 9 is formed between the first doping semiconductor area 1 and the semiconductor substrate 7. In this manner, the buried insulating layer 9 is formed between the first doping semiconductor area 1 and the semiconductor substrate 7, so that a leakage current can be reduced. (c) of FIG. 6 is a cross-sectional view illustrating a cell string where a well having a doping type different from that of the first doping semiconductor area 1 is formed under the first doping semiconductor area 1. In this case, an electrical contact window 42 of the well is separately formed at side of the isolation insulating layer 8 of the cell string.

Figure 7:
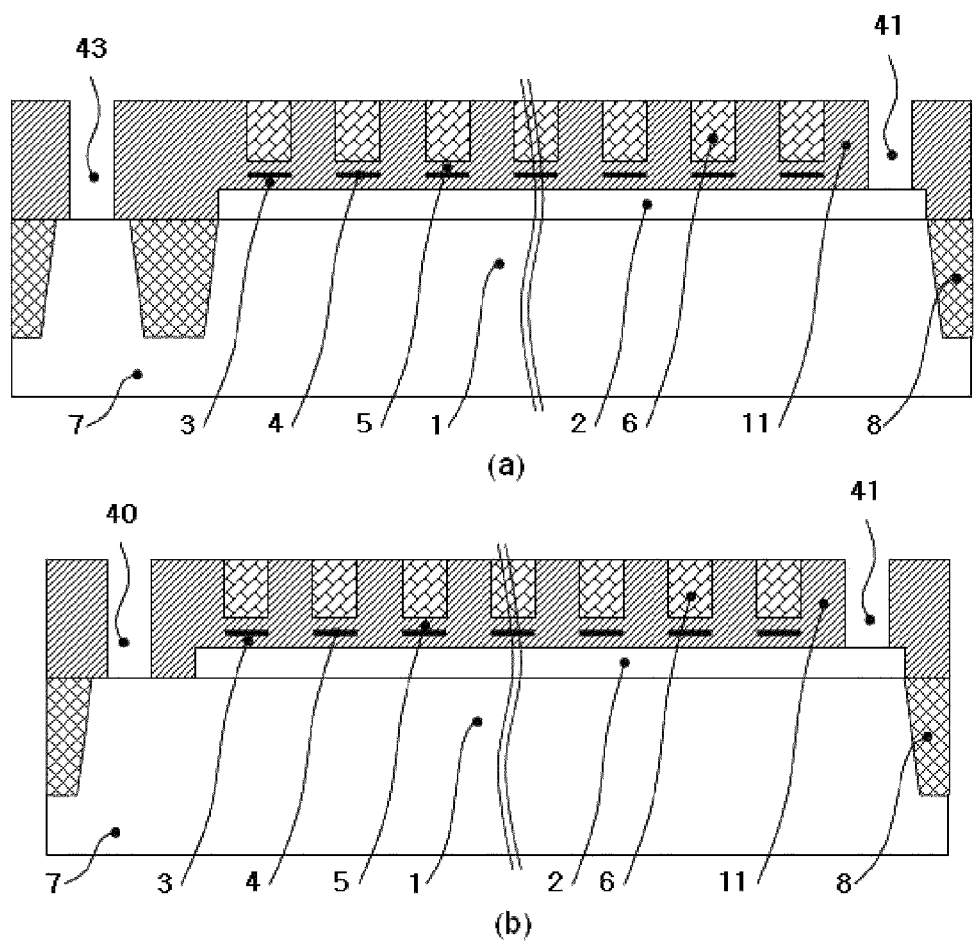

FIG. 7 illustrates cross-sectional views of various modified examples of the cell string according to the third embodiment of the present invention illustrated in FIG. 5. The cell strings illustrated in (a) and (b) of FIG. 7 are similar to the cell string illustrated in (a) of FIG. 5 except that the second doping semiconductor area 2 is configured to protrude in comparison with the surface of the isolation insulating layer 8. In the cell strings illustrated in (a) and (b) of FIG. 7, the second doping semiconductor area 2 is formed by forming an epitaxial layer which is locally doped in an in-situ manner. In other embodiments, the second doping semiconductor area 2 is doped with a high doping concentration ($>10^{18}$ cm$^{-3}$) by using an ion injection process. However, the ion injection process with a high doping concentration may cause defects on the surface of the semiconductor substrate. The defects may be reduced in a following thermal treatment process, but the defects may affect a band-to-band tunneling phenomenon. Therefore, in the embodiment, an epitaxial layer is provided. Since the ion injection process may be optimized in the following thermal treatment process, the introduction of the epitaxial layer growth is determined according to the process. In the case of (a) of FIG. 7, an isolation insulating layer 8 is formed between the electrical contact window 43 of the first doping semiconductor area 1 and the cell device. In the case of (b) of FIG. 7, the electrical contact window 40 of the first doping semiconductor area is connected to the cell device, but the isolation insulating layer 8 is not formed between the cell device and the electrical contact window 40.

Figure 8:
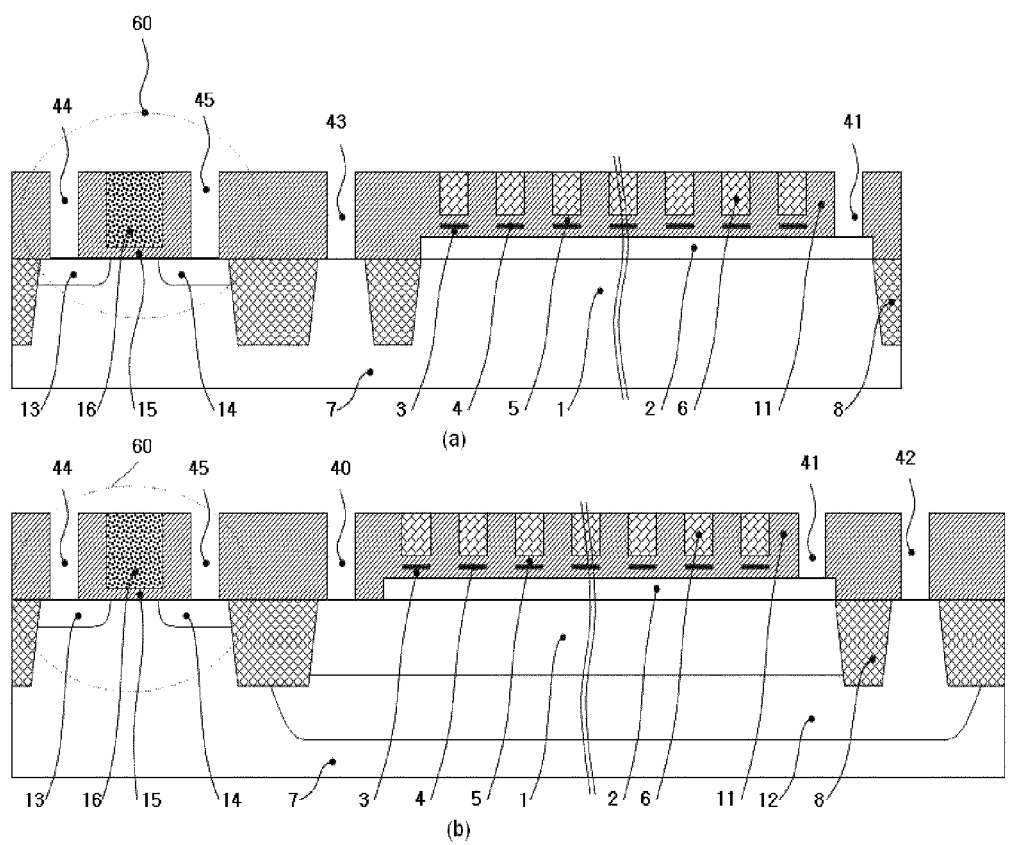
FIG. 8 is cross-sectional views illustrating a state where the cell string illustrated in (a) of FIG. 7 and a MOS device as a control circuit are integrated.

Now, a structure where the cell string according to the present invention and a MOS device as a control circuit are integrated is described. FIG. 8 illustrates cross-sectional views of the structure where the cell string illustrated in (a) of FIG. 7 and the MOS device as a control circuit are integrated. Referring to (a) of FIG. 8, the cell string and the MOS device 60 are integrated. The MOS device 60 includes a semiconductor substrate 7, a source 13, a drain 14, a gate insulating layer 15, and a gate electrode 16. For the cell string that is a memory device array, a peripheral control circuit for controlling the devices is needed, and the peripheral control circuit is configured in a MOS transistor structure. Herein, in the MOS device 60 that is the control circuit, electrical contact windows 44 and 45 for the source and the drain are formed in the upper portion of the source and the drain. The structure of (b) of FIG. 8 is similar to the structure of (b) of FIG. 8 except that a well 12 is provided to the cell string and a first doping semiconductor area 1 is formed in the well 12. As described above, in order to separate the first doping semiconductor area 1 from the semiconductor substrate 7, the well 12 is configured so as to have the doping type different from that of the first doping semiconductor area 1, and an electrical contact window 42 for electrical contact of the well 12 is formed at the end of the cell string.

Figure 9:
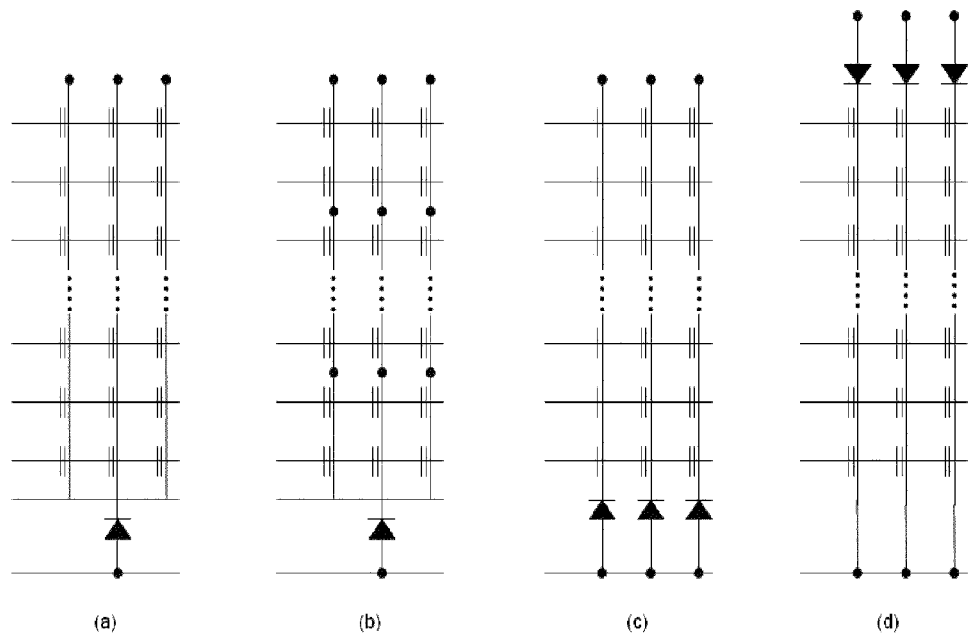
FIG. 9 is equivalent circuit diagrams illustrating examples of cell arrays implementing by arraying cell strings according to the present invention.

FIG. 9 illustrates equivalent circuit diagrams of examples of cell arrays constructed by arraying the cell strings according to the present invention. The directions of the diodes illustrated in FIG. 9 may be changed according to the doping types of the first and second doping semiconductor areas. In the figures, the directions are exemplarily illustrated as one direction. (a) of FIG. 9 is an equivalent circuit diagram illustrating the case where a plurality of the cell strings commonly use the first doping semiconductor area. (b) of FIG. 9 is similar to (a) of FIG. 9 except that electrical contact points are provided at appropriate positions of the cell strings. Due to this configuration, it is possible to solve a problem occurring in the case where the resistance of the second doping semiconductor area 2 is large in the two end portions of the cell string. (c) of FIG. 9 is an equivalent circuit diagram illustrating the case where the electrical contact points of the first doping semiconductor areas are independently provided to the cell strings. (d) of FIG. 9 is an equivalent circuit diagram illustrating the case where the electrical contact points are formed in the first doping semiconductor areas, which are electrically independent, and the other end portions of the cell strings are electrically connected to each other.

Fourth Embodiment: Cell String

Figure 10:
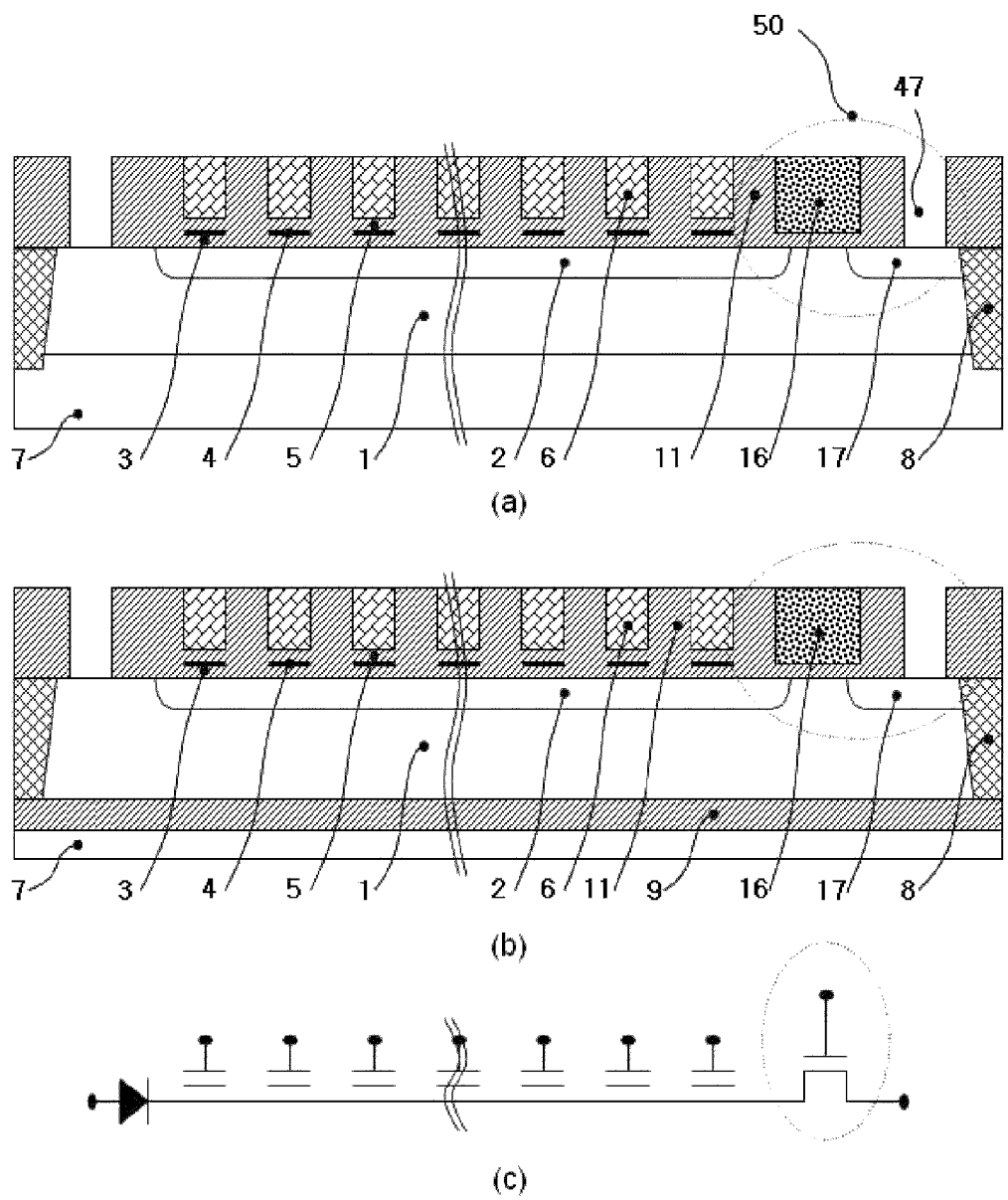
FIG. 10 is cross-sectional views illustrating a cell string including cell devices and a switching device according to a fourth embodiment of the present invention.

Now, a structure and operations of a cell string according to a fourth embodiment of the present invention are described. The cell string according to the fourth embodiment of the present invention includes cell devices arrayed in a row and a switching device 50 which is configured to select the cell string, and the switching device 50 is disposed at the end portion of the cell devices FIG. 10 is cross-sectional views illustrating the cell string according to the fourth embodiment of the present invention including cell devices and switching devices. Referring to (a) of FIG. 10, the cell string according to the fourth embodiment of the present invention includes a plurality of the cell devices arrayed in a row and one or two or more switching devices 50 connected to the two end portions of the connected cell devices, and control electrodes 6 of the cell devices are separated from each other by insulating layers 11. The cell device includes a first doping semiconductor area 1 which is formed on a semiconductor substrate 7, a second doping semiconductor area 2 which is formed on the first doping semiconductor area, a tunneling insulating layer 3 which is formed on the second doping semiconductor area, a charge storage node 4, a blocking insulating layer 5, and a control electrode 6 which are sequentially formed on the tunneling insulating layer 3. The switching device includes the first doping semiconductor area 1 which is formed on the semiconductor substrate 7, a gate insulating layer, a gate electrode 16, and a source or drain 17. In the switching device, an electrical contact window 47 is formed to the source or drain 17 in the portion which is not connected to the cell device, and an electrode is connected to the electrical contact window 47. In addition, an electrode for electrical contact with the connected first doping semiconductor area is included. In FIG. 10, the switching device is formed at the one end portion of the cell string. The structure of the cell string illustrated in (b) of FIG. 10 is similar to that of the cell string illustrated in (a) of FIG. 10 except that a buried the insulating layer 9 is further included between the semiconductor substrate 7 and the first doping semiconductor area 1. (c) of FIG. 10 is an equivalent circuit diagram of the cell string structure illustrated in (a) and (b) of FIG. 10. The direction of a diode is also arbitrarily set. It can be seen from (a) of FIG. 10 that the first doping semiconductor area 1 is formed in a well which is formed in the semiconductor substrate 7 having a different doping type.

Now, modified structures of the cell string according to the fourth embodiment of the present invention are described.

Figure 11:
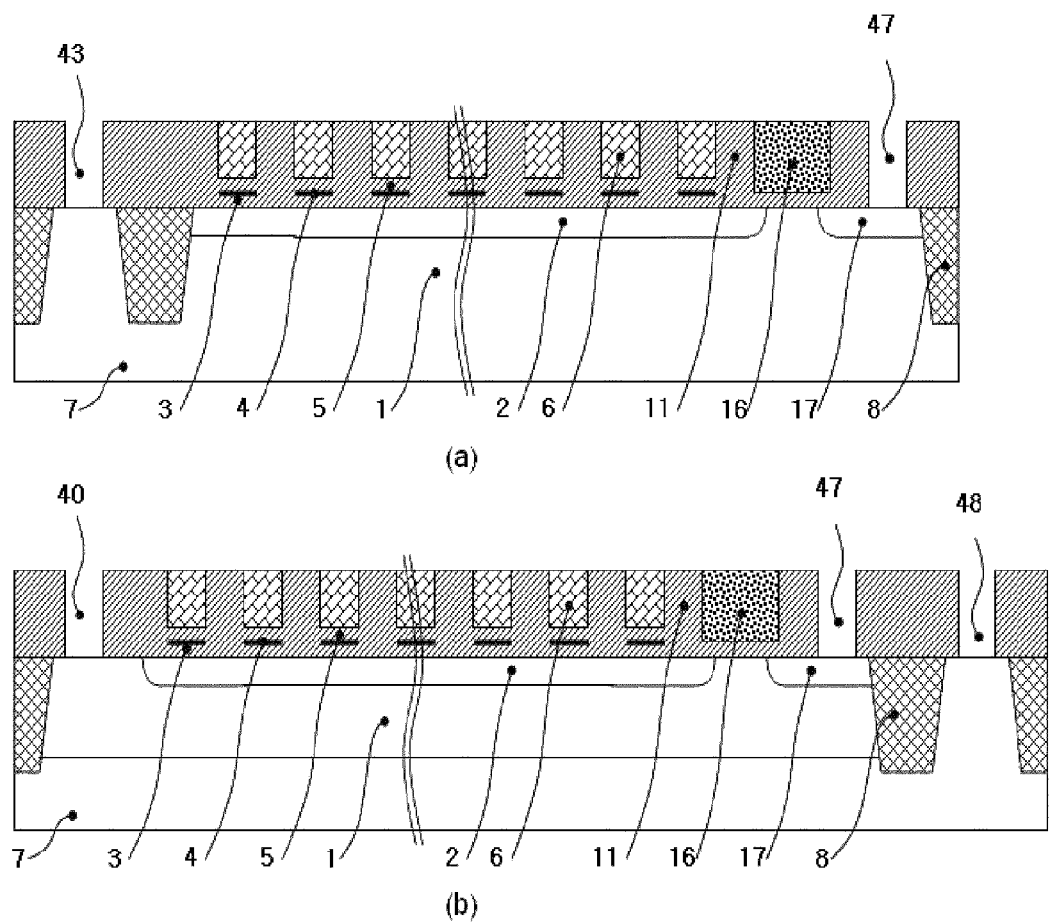
FIGS. 11 and 12 are cross-sectional views illustrating modified structures of the cell string according to the fourth embodiment of the present invention.

(a) and (b) of FIG. 11 are cross-sectional views illustrating the modified structures of the cell string according to the fourth embodiment illustrated in FIG. 10. (a) of FIG. 11 is similar to the fourth embodiment illustrated in (a) of FIG. 10 except that the first doping semiconductor area 1 is not distinguished from the semiconductor substrate 7. (b) of FIG. 11 is different from the structure illustrated in (a) of FIG. 11 in that the first doping semiconductor area 1 is formed in a well doped with impurities of the opposite type and in that an isolation insulating layer 8 is disposed between an electrical contact window 48 of electrical contact with the well and the cell device. In addition, the structure illustrated in (b) of FIG. 11 is different from the structure illustrated in (a) of FIG. 11 in that there is no isolation insulating layer 8 between the electrical contact window 40 of the first doping semiconductor area 1 and the cell device.

Figure 12:
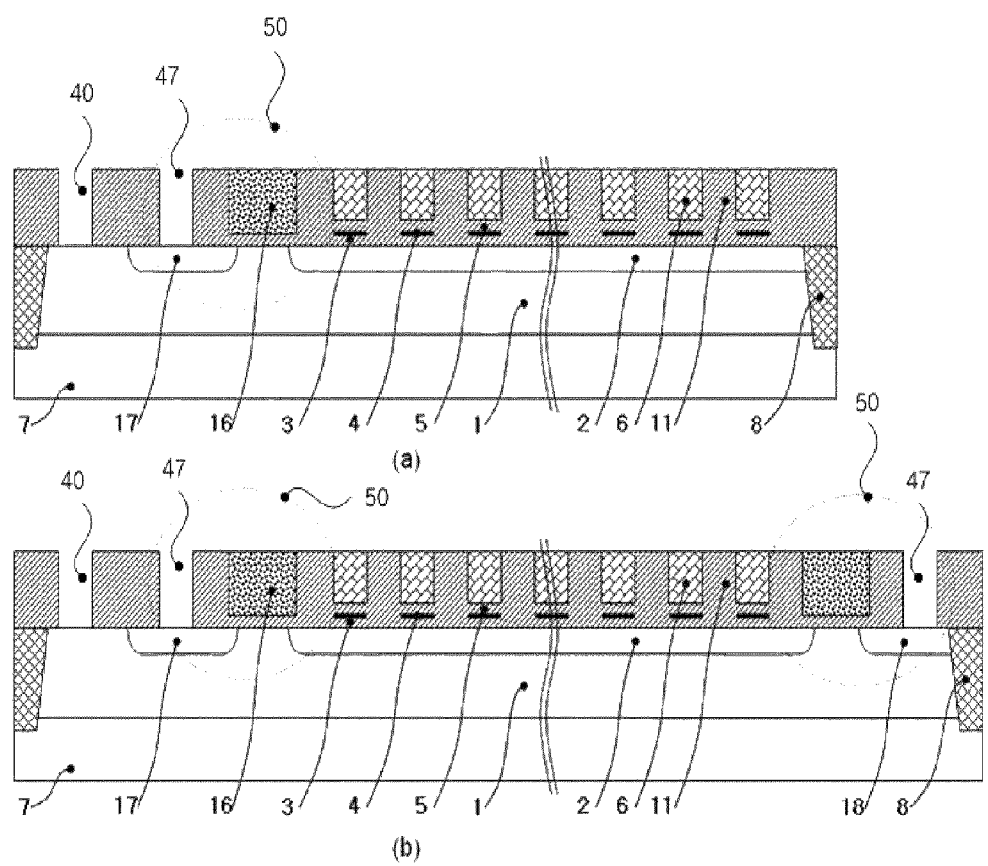

(a) and (b) of FIG. 12 are cross-sectional views illustrating different modified structures of the cell string according to the fourth embodiment illustrated in FIG. 10. The structure illustrated in (a) of FIG. 12 is similar to the fourth embodiment illustrated in (a) of FIG. 10 except that the switching device is located at the left side of the cell string. The structure illustrated in (b) of FIG. 12 is different from the fourth embodiment in that the switching devices are disposed at the two end portions of the array of cell devices.

Figure 13:
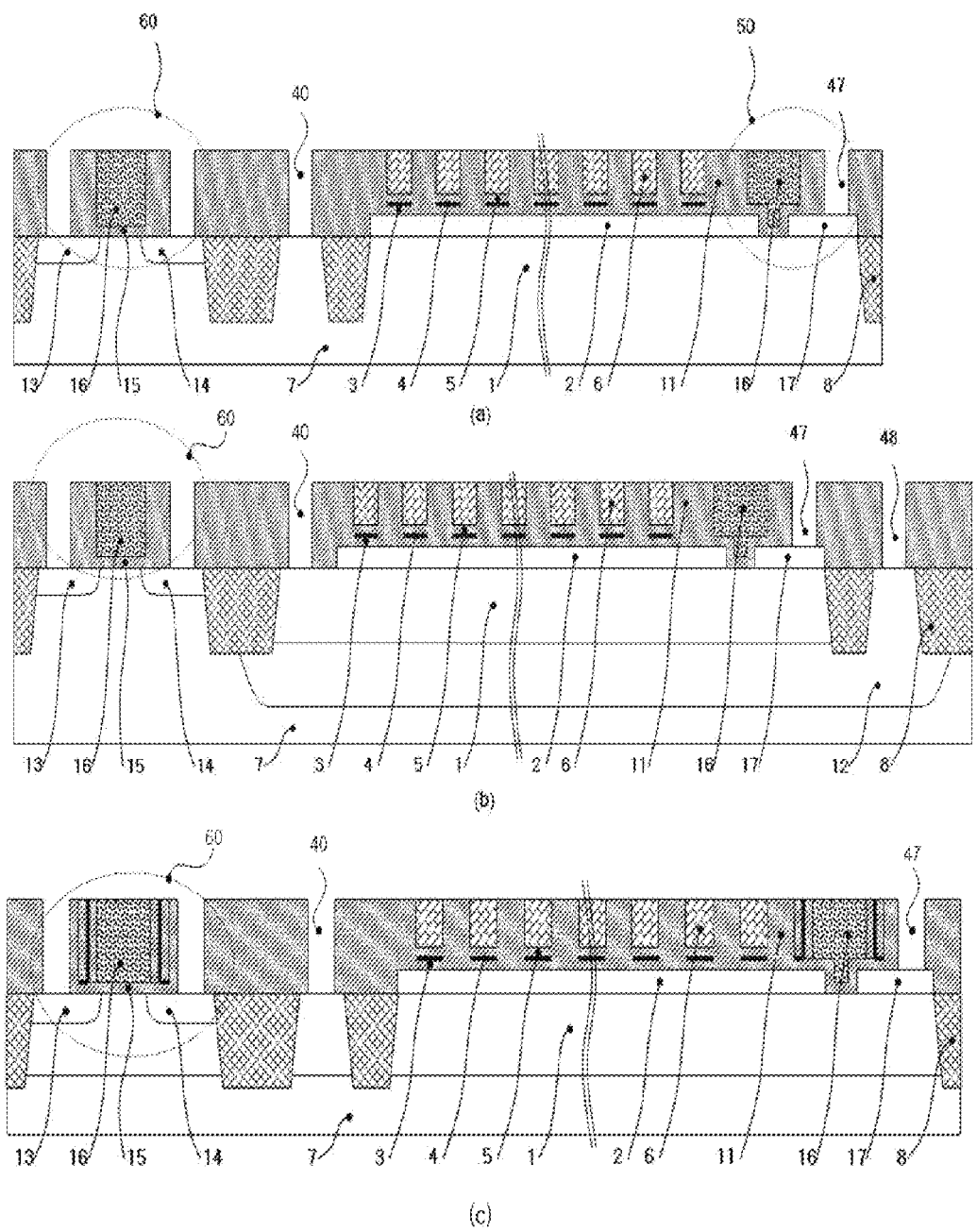
FIG. 13 is cross-sectional views illustrating a structure where the cell string including a switching device according to the fourth embodiment of the present invention and a MOS device as a control circuit are integrated.

Now, a structure where the cell string including a switching device according to the fourth embodiment of the present invention and a control circuit are integrated is described. FIG. 13 illustrates cross-sectional views of the structure where the cell string including a switching device according to the fourth embodiment of the present invention and a MOS device as a control circuit are integrated. Referring to (a) and (b) of FIG. 13, the MOS device 60 as the control circuit is formed at the end of the cell string including the cell devices and the switching device. In FIG. 13, (a) and (b) is different from each other according to whether or to first doping semiconductor area 1 is formed in a well 12 having a different doping type. In (a) of FIG. 13, the first doping semiconductor area 1 and the semiconductor substrate 7 are shared, so that a substrate contact window for electrical contact can be shared. In (b) of FIG. 13, the first doping semiconductor area 1 is formed in the well 12 having a different doping type, and a separate electrical contact window 48 is formed in order to provide electrical contact of the well 12.

Figure 14:
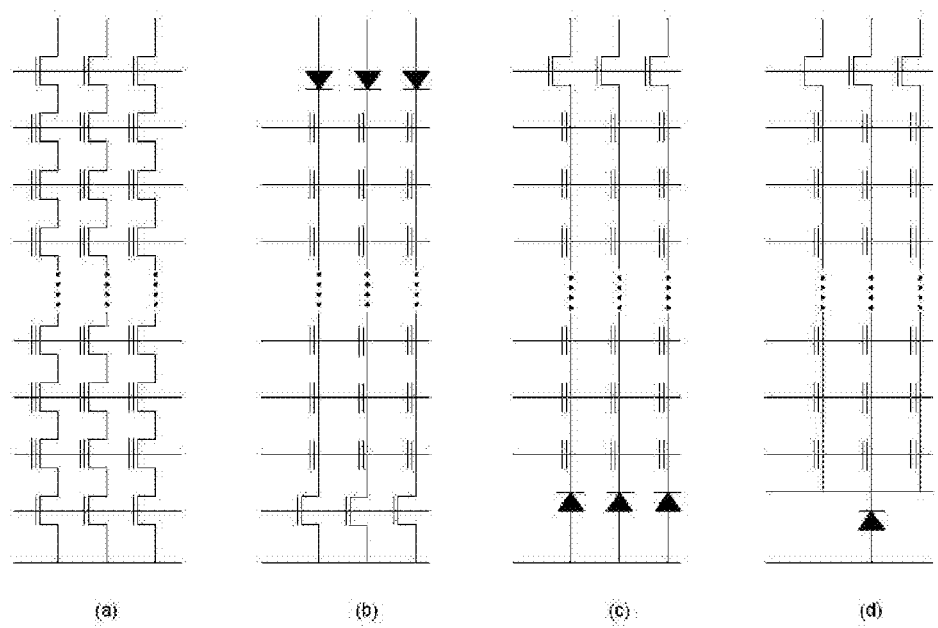
FIG. 14 is equivalent circuit diagrams illustrating types of cell string arrays configured by arraying the cell strings having the switching device according to the present invention.

FIG. 14 illustrates an equivalent circuit diagram of arrays configured by disposing the cell strings including the switching devices. (a) of FIG. 14 illustrates a conventional NAND flash structure as a reference. (b) to (d) of FIG. 14 illustrates arrays configured with the cell devices according to the present invention. (b) of FIG. 14 illustrates the case where the drains 17 of the switching devices of the cell strings are connected to each other and the first doping semiconductor areas are electrically separated. Contrary to (b) of FIG. 14, (c) of FIG. 14 illustrates the case where the first doping semiconductor areas 1 of the cell strings are connected to each other and the portions of the switching devices are electrically separated. (d) of FIG. 14 is similar to (c) of FIG. 14 except that the first doping semiconductor areas of the cell strings are connected to each other by sharing one contact window.

In the aforementioned cell devices or cell strings according to the first to fourth embodiments of the present invention, the first doping semiconductor area may be a p type semiconductor or an n type semiconductor, and the second doping semiconductor area and the first doping semiconductor area need to be doped with opposite types of impurities. Therefore, in the case where the first doping semiconductor area is of a p type, the second doping semiconductor area needs to be of an n type. In the case where the first doping semiconductor area is an n type, the second doping semiconductor area needs to be of a p type.

In the aforementioned cell devices or cell strings according to the first to fourth embodiments of the present invention, the surface of the second doping semiconductor area of the flash memory cell device is configured so that the height of a position in the central portion of the control electrode in the direction parallel to or perpendicular to the control electrode is larger than the height of positions in the two end portions of the control electrode. Therefore, the surface of the second doping semiconductor area is formed to protrude in a sharp or round shape, so that it is possible to improve write/erase characteristics.

In the aforementioned cell devices or cell strings according to the first to fourth embodiments of the present invention, the buried insulating layer is formed under the first doping semiconductor area, so that it is possible to reduce the leakage current effect.

In the aforementioned cell devices or cell strings according to the first to fourth embodiments of the present invention, the charge storage node may be formed so as to be localized under the control electrode or formed so as to be extended in the left and right directions of the control electrode.

In the aforementioned cell devices or cell strings according to the first to fourth embodiments of the present invention, the tunneling insulating layer may be formed as one layer or a plurality of layers, and in the case where the tunneling insulating layer is formed as a plurality of layers, adjacent layers may be made of materials having different band gaps.

In the aforementioned cell devices or cell strings according to the first to fourth embodiments of the present invention, the blocking insulating layer of the cell device may be formed as one layer or a plurality of layers, and the blocking insulating layer is formed as a plurality of layers, adjacent layers may be made of materials having different band gaps.

In the aforementioned cell devices or cell strings according to the first to fourth embodiments of the present invention, the charge storage node may be formed as a conductive film made of a conductive material, as an insulating layer made of an insulating material, as a nano-sized dot or a nano-sized crystal, or as a combination of an insulating layer and a nano-sized dot.

In the aforementioned cell devices or cell strings according to the first to fourth embodiments of the present invention, in a case where the charge storage node is constructed with a conductive film, the conductive film may include one or two or more of a semiconductor, a metal, a metal-nitride film, a multi-element metal, and a silicide; in a case where the charge storage node is constructed with an insulating layer, the insulating layer may include one or two more of a nitride film and a metal oxide film; in a case where the charge storage node is constructed with a nano-sized dot, the dot may include one or more of a semiconductor material, a metal oxide, a metal, a metal nitride, and a silicide material; and in a case where the charge storage node is constructed with a combination of a thin film and a nano-sized dot, an insulating layer and a nano-sized dot having a conductive property or an insulating property may be used.

In the aforementioned cell devices or cell strings according to the first to fourth embodiments of the present invention, the control electrode of the cell device may be constructed with one or two or more combinations among highly-doped Si, poly Si, Ge, poly Ge, SiGe, poly SiGe, amorphous Si, amorphous Ge, amorphous SiGe, a metal nitride, a metal, and a silicide.

In the aforementioned cell devices or cell strings according to the first to fourth embodiments of the present invention, the flash memory cell device may read an amount of a current flowed due to GIDL (Gate Induced Drain Leakage) between the first doping semiconductor area and the second doping semiconductor area according to a state of program or erase to sense the state or degree of program of the cell device. In the specification of the present invention, "the current flowed due to GIDL" denotes is a current generated through movement of one type carriers among electrons and holes of the electron-hole pairs, which are generated in the second doping semiconductor area 2 under the voltage applied to the control electrode and the first and second doping semiconductor areas, to the electrode contacting with the second doping semiconductor area 2.

In the aforementioned cell devices or cell strings according to the first to fourth embodiments of the present invention, multiple levels of two bits or more can be stored in one cell by adjusting a program voltage, an erase voltage, a program time, or an erase time of the cell device.

In the aforementioned cell devices or cell strings according to the first to fourth embodiments of the present invention, the second doping semiconductor area is formed as a semiconductor epitaxial layer which is doped in an in-situ manner, so that it is possible to improve uniformity of characteristics of the cell device.

In the aforementioned cell string including no switching device according to the third embodiments of the present invention, with respect to the positions of the electrical contact windows formed in the second doping semiconductor area of the cell string, the electrical contact windows are formed at the two end portions of the cell string; the electrical contact window is selectively formed at one of the two end portions; or the electrical contact window is formed at an arbitrary position between the cell devices.

In the aforementioned cell string including a switching device according to the fourth embodiment of the present invention, the gate insulating layer of the switching device may be constructed with the blocking insulating layer, the charge storage node, and the tunneling insulating layer which are the same as those of the cell device or formed as a one-layered insulating layer or a multi-layered insulating layer.

In the aforementioned cell string including a switching device according to the fourth embodiment of the present invention, one or two or more switching devices may be formed at two end portions of the cell string or at one of the two end portions.

In the aforementioned cell strings according to the third and fourth embodiments of the present invention, in the case where a cell array is formed by arraying the cell strings in an array structure, isolation insulating layers may be used to electrical separate the cell strings from each other. In this manner, in the cell array where the cell strings are disposed in an array structure, a buried insulating layer formed under the first doping semiconductor area is further included, so that the buried insulating layer together with the isolation insulating layers formed around the cell strings can electrically separate the cell strings from each other in the cell array, or so that it is possible to reduce a leakage current in a junction. In the aforementioned cell array, the electrical contact window of the first doping semiconductor area is formed through the contact of the semiconductor substrate which is commonly formed, or the first doping semiconductor area is formed in a well having a different doping type and the electrical contact window of the first doping semiconductor area may be formed independently in each cell string or in each cell string module which include several cell strings. With respect to the cell string, the cell string and the MOS device as a control circuit may be integrated in the same substrate.

Now, methods of fabricating a cell string constructed with cell devices having the aforementioned structure according to the present invention are described.

Figure 15:
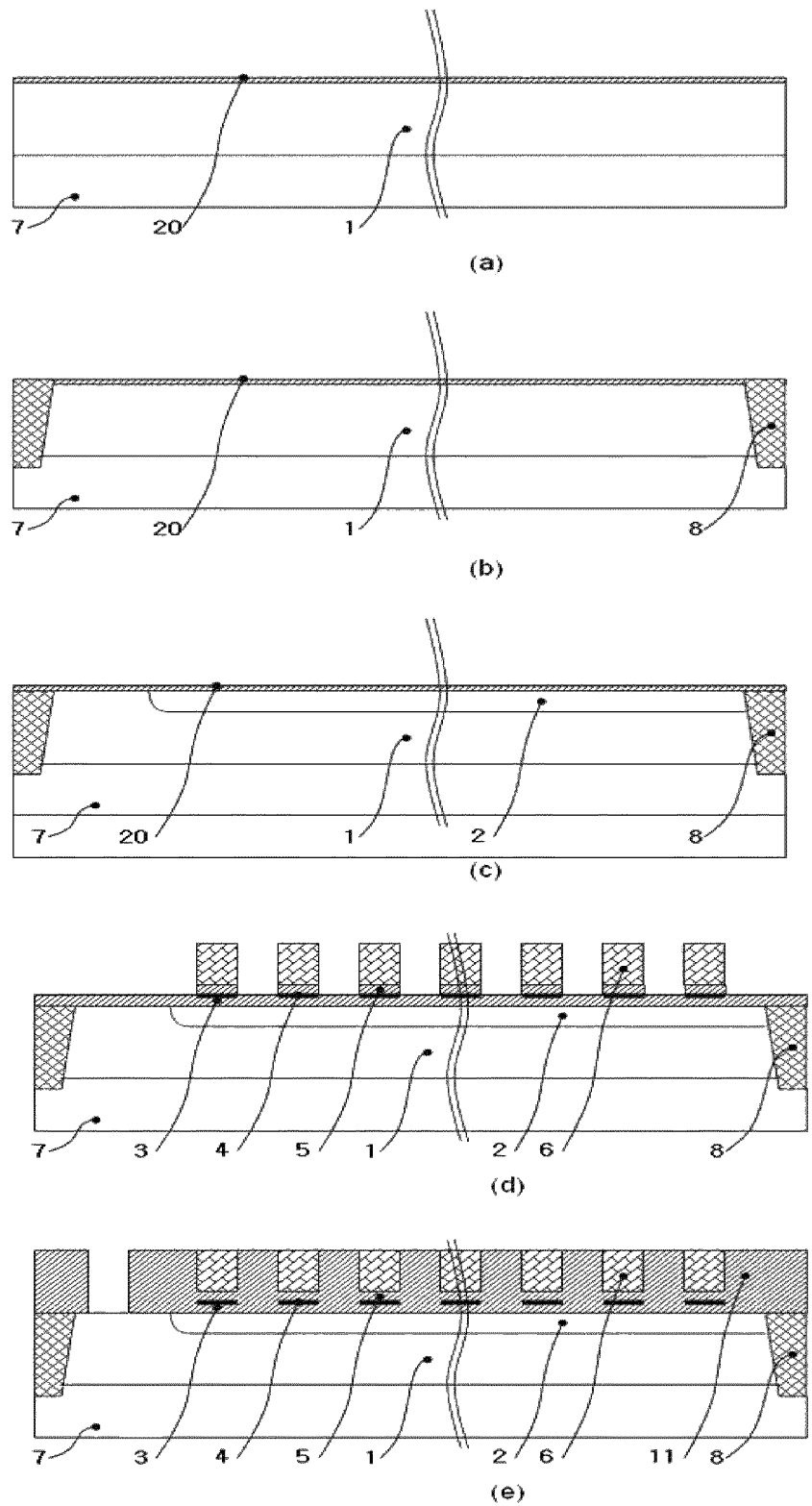
FIG. 15 is cross-sectional views sequentially illustrating steps of fabricating the cell string illustrated in (a) of FIG. 6.

FIG. 15 illustrates cross-sectional views sequentially illustrating process of fabricating a cell string illustrated in (a) of FIG. 6. The processes of fabricating the cell string illustrated in (a) of FIG. 6 are described in detail with reference to FIG. 15. First, as illustrated in (a), a third insulating layer 20 is formed on a surface of a semiconductor substrate 7, and a first doping semiconductor area 1 is formed. Next, as illustrated in (b), an isolation insulating layer 8 as a device isolation area is formed on the resulting product of the process (a). Next, as illustrated in (c), a second doping semiconductor area 2 is formed on the resulting product of the process (b). Next, as illustrated in (d), a tunneling insulating layer 3, a charge storage node 4, a blocking insulating layer 5 are sequentially formed on the resulting product, and a control electrode 6 is formed thereon. Next, as illustrated in (e), a first insulating layer as an interlayer insulating layer is formed, and contacts are formed at the contact required portions. After that, metal interconnections are sequentially formed.

Figure 16:
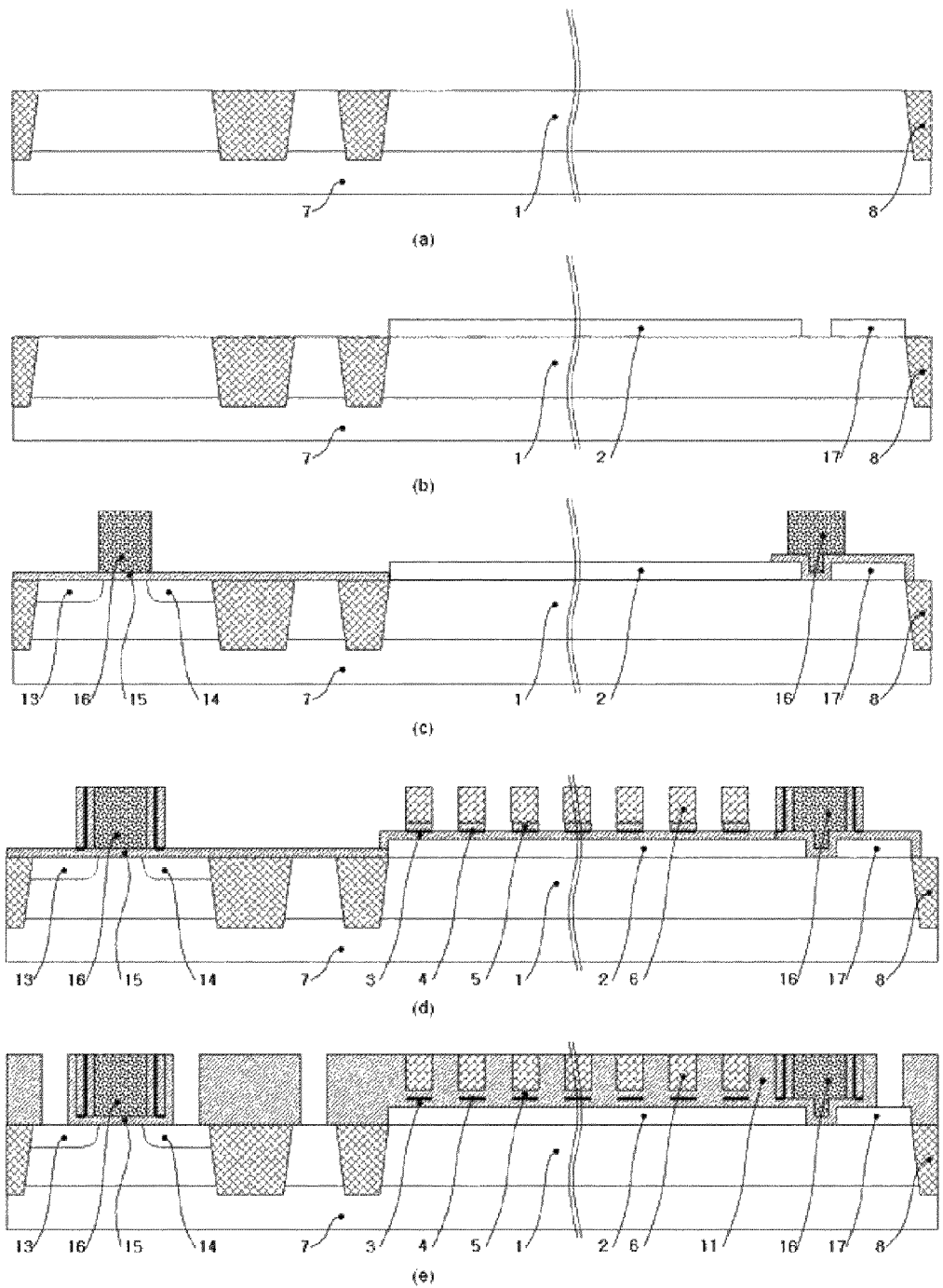
FIG. 16 is cross-sectional views sequentially illustrating steps of fabricating the structure where the cell string and the control circuit illustrated in (c) of FIG. 13 are integrated.

FIG. 16 illustrates cross-sectional views sequentially illustrating processes of fabricating a structure where the cell string illustrated in of FIG. 13 and the control circuit are integrated. The processes of fabricating the structure where the cell string having the switching device illustrated in of FIG. 13 and the MOS device as a control circuit are integrated are described in detail with reference to FIG. 16. First, as illustrated in (a), a first doping semiconductor area 1 is formed on a semiconductor substrate 7, and an isolation insulating layer 8 as a device isolation area is formed on the resulting product. Next, as illustrated in (b), a second doping semiconductor area 2 is formed as an epitaxial layer on the resulting product. Next, as illustrated in (c), a switching device and a MOS device are formed on the resulting product. Next, as illustrated in (d), a tunneling insulating layer 3, a charge storage node 4, and a blocking insulating layer 5 for the cell device are sequentially formed on the resulting product, and a control electrode 6 is formed thereon. Next, as illustrated in (e), a first insulating layer 11 as an interlayer insulating layer is formed, and contacts are formed at the contact required portions. After that, metal interconnections are sequentially formed.

In the aforementioned fabricating process, before the step (a), a step of forming a well, which is doped with impurities of a semiconductor type opposite to a semiconductor type of impurities of the second doping semiconductor area, in a localized portion and performing drive-in may be included.

In the aforementioned fabricating process, the step of forming the second doping semiconductor area may be a step of doping impurities by performing an ion injection process and an annealing process or a step of doping impurities during epitaxial layer growth in an in-situ manner.

In the aforementioned fabricating process, the step of forming the switching device may be performed in the step of forming the cell device in the step (d). In addition, the step of forming the MOS device and the switching device and the step of forming the cell device in the step (d) may be exchanged in the processing order.

Figure 17:
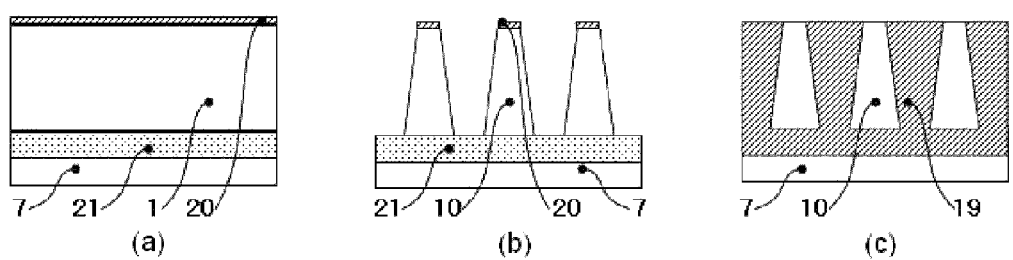
FIG. 17 is cross-sectional views illustrating main processing steps of selectively a buried insulating layer 9 under a first doping semiconductor area 1 in a cell string fabricating process according to the present invention.

FIG. 17 is cross-sectional views illustrating main processing steps of selectively the buried insulating layer 9 under the first doping semiconductor area 1 in the cell string fabricating process according to the present invention. First, as illustrated in (a) of FIG. 17, a sacrifice semiconductor layer 21 is formed on the surface of the semiconductor substrate 7; a semiconductor layer where the first doping semiconductor area 1 is to be included is formed on the sacrifice semiconductor layer 21; and a third insulating layer 20 is formed on the semiconductor layer. At this time, the sacrifice semiconductor layer 21 is made of a material such as SiGe having an etch rate larger than that of the semiconductor substrate. Next, as illustrated in (b), after patterning is performed by using a photolithography process, etching is performed down to the sacrifice semiconductor layer 21 to form a fence-shaped body 10. Next, as illustrated in (c), after the exposed sacrifice semiconductor layer 21 is selectively etched, a second insulating layer 19 is deposited, and after that, planarization is performed. These processes may be effectively performed in the left and right portions of the fence-shaped body 10.

While the present invention has been particularly shown and described with reference to exemplary embodiments thereof, it will be understood by those skilled in the art that various changes in form and details may be made therein without departing from the spirit and scope of the invention as defined by the appended claims. The exemplary embodiments should be considered in descriptive sense only and not for purposes of limitation. Therefore, the scope of the invention is defined not by the detailed description of the invention but by the appended claims, and all differences within the scope will be construed as being included in the present invention.

INDUSTRIAL APPLICABILITY

Structures of cell devices and cell strings according to the present invention can be widely used in the field of a non-volatile semiconductor memory.

The invention is claimed:
1. A diode-based flash memory cell string comprising a plurality of cell devices connected in a row,
  each of the cell devices including:
  a semiconductor substrate;
  a first doping semiconductor area doped with impurities of a first semiconductor type and formed on the semiconductor substrate;
  a second doping semiconductor area doped with impurities of a second semiconductor type and formed on the first doping semiconductor area;
  a charge storage structure formed on the second doping semiconductor area, the charge storage structure including a tunneling insulating layer formed on the second doping semiconductor area, a charge storage node formed on the tunneling insulation layer and a blocking insulating layer formed on the charge storage node; and
  a control electrode formed on the charge storage structure,
  wherein the first doping semiconductor areas of the cell devices are connected to each other, the second doping semiconductor areas of the cell devices are connected to each other;
  wherein all the first doping semiconductor areas of the cell devices are connected to each other, all the second doping semiconductor areas of the cell devices are connected to each other;
  wherein the cell string comprises a first electrode for the connected first doping semiconductor areas and a second electrode for the connected second doping semiconductor areas;
  wherein the first and second doping semiconductor areas of the cell string operates as a diode by controlling the voltage applied to the first and second electrodes so that the information of cell devices in the cell string is read by current which flows between the first and second doping semiconductor areas.

2. The diode-based flash memory cell string according to claim 1, further comprising a switching device at one end portion or both end portions of the connected cell devices,
  wherein the switching device includes:
  the semiconductor substrate;
  the first doping semiconductor area;
  a gate insulating layer formed on the first doping semiconductor area;
  a gate electrode formed on the gate insulating layer; and
  source or drain formed on the first doping semiconductor area.

3. The diode-based flash memory cell string according to claim 1, wherein each of the cell devices further includes a buried insulating layer formed under the first doping semiconductor area.

4. The diode-based flash memory cell string according to claim 1, further comprising an isolation insulating layer for isolation from a neighboring cell string.

* * * * *